(12) United States Patent
Kabansky

(10) Patent No.: US 6,346,488 B1
(45) Date of Patent: *Feb. 12, 2002

(54) PROCESS TO PROVIDE ENHANCED RESISTANCE TO CRACKING AND TO FURTHER REDUCE THE DIELECTRIC CONSTANT OF A LOW DIELECTRIC CONSTANT DIELECTRIC FILM OF AN INTEGRATED CIRCUIT STRUCTURE BY IMPLANTATION WITH HYDROGEN IONS

(75) Inventor: Alex Kabansky, Santa Clara, CA (US)

(73) Assignee: LSI Logic Corporation, Milpitas, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/605,382

(22) Filed: Jun. 27, 2000

(51) Int. Cl.⁷ ............................................. H01L 21/31
(52) U.S. Cl. ...................... 438/783; 438/788; 438/798; 438/520
(58) Field of Search ................................ 438/783, 788, 438/798, 520

(56) References Cited

U.S. PATENT DOCUMENTS

| | | | |
|---|---|---|---|
| 3,012,861 A | 12/1961 | Ling ........................ | 23/223.5 |
| 3,178,392 A | 4/1965 | Kriner ...................... | 260/46.5 |
| 3,832,202 A | 8/1974 | Ritchie ...................... | 106/287 |
| 3,920,865 A | 11/1975 | Läufer et al. ............... | 427/220 |
| 4,705,725 A | 11/1987 | Glajch et al. ............... | 428/405 |
| 4,771,328 A | 9/1988 | Malaviya et al. ............ | 357/49 |
| 5,194,333 A | 3/1993 | Ohnaka et al. .............. | 428/405 |
| 5,314,845 A | 5/1994 | Lee et al. .................... | 437/238 |
| 5,364,800 A | 11/1994 | Joyner ........................ | 437/28 |
| 5,376,595 A | 12/1994 | Zupancic et al. ............ | 501/12 |
| 5,470,801 A | 11/1995 | Kapoor et al. .............. | 437/238 |
| 5,558,718 A | * 9/1996 | Leung ..................... | 118/723 E |

(List continued on next page.)

FOREIGN PATENT DOCUMENTS

| | | | |
|---|---|---|---|
| DE | 198 04 375 A1 | 7/1999 | ......... H01L/21/312 |
| EP | 0 706 216 A2 | 4/1996 | ......... H01L/23/532 |
| EP | 0 949 663 A2 | 10/1999 | ......... H01L/21/312 |
| JP | 63-003437 | 1/1988 | ........... H01L/21/90 |
| JP | 2000-267128 | 9/2000 | ........... G02F/1/136 |
| WO | WO 99/41423 | 8/1999 | |

OTHER PUBLICATIONS

Chu, Paul K., et al., "A New Way to Make SOI Wafers", *Solid State Technology*, May, 1997.

Dobson, C.D., et al., "Advanced $SiO_2$ Planarization Using Silane and $H_2O_2$", *Semiconductor International*, Dec. 1994, pp 85–88.

En, William G., et al., "The Genesis Process™: A New SOI Fabrication Method", Silicon Genesis Corporation, 590 Division Street, Campbell, CA 95008.

(List continued on next page.)

Primary Examiner—John A. Niebling
Assistant Examiner—Lynne A. Gurley

(57) ABSTRACT

A film of low k dielectric material formed on a semiconductor substrate is treated to inhibit cracking of the film of low k dielectric material during subsequent exposure of the film of low k dielectric material to elevated temperatures by implanting the film of low k dielectric material with hydrogen ions by applying a negative DC bias to the semiconductor substrate in the presence of a plasma of hydrogen ions. The semiconductor substrate is mounted on an electrically conductive substrate support in a reactor and the negative DC bias is applied to the semiconductor substrate by connecting the electrically conductive substrate support to a source of negative DC bias while hydrogen ions are generated by the plasma in the reactor to thereby cause the hydrogen ions to implant into the film of low k dielectric material on the semiconductor substrate.

20 Claims, 1 Drawing Sheet

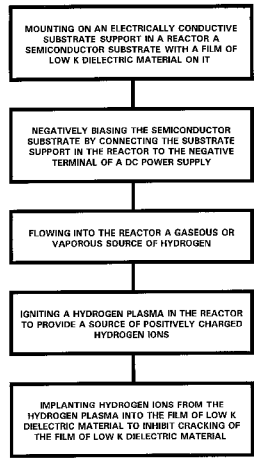

U.S. PATENT DOCUMENTS

| | | | | |
|---|---|---|---|---|
| 5,559,367 A | | 9/1996 | Cohen et al. | 257/77 |
| 5,580,429 A | * | 12/1996 | Chan et al. | 204/192.38 |
| 5,628,871 A | | 5/1997 | Shinagawa | 438/514 |
| 5,675,187 A | | 10/1997 | Numata et al. | 257/758 |
| 5,688,724 A | | 11/1997 | Yoon et al. | 437/235 |
| 5,858,879 A | | 1/1999 | Chao et al. | 438/725 |
| 5,864,172 A | | 1/1999 | Kapoor et al. | 257/634 |
| 5,874,367 A | | 2/1999 | Dobson | 438/787 |
| 5,874,745 A | | 2/1999 | Kuo | 257/59 |
| 5,882,489 A | | 3/1999 | Bersin et al. | 204/192.35 |
| 5,904,154 A | | 5/1999 | Chien et al. | 134/1.2 |
| 5,915,203 A | | 6/1999 | Sengupta et al. | 438/669 |
| 5,939,763 A | | 8/1999 | Hao et al. | 257/411 |
| 6,025,263 A | | 2/2000 | Tsai et al. | 438/624 |
| 6,028,015 A | * | 2/2000 | Wang et al. | 438/789 |
| 6,037,248 A | | 3/2000 | Ahn | 438/619 |
| 6,043,167 A | | 3/2000 | Lee et al. | 438/789 |
| 6,051,073 A | * | 4/2000 | Chu et al. | 118/723 |
| 6,051,477 A | | 4/2000 | Nam | 438/404 |
| 6,066,574 A | | 5/2000 | You et al. | 438/781 |
| 6,107,192 A | * | 8/2000 | Subrahmanyan et al. | 438/637 |
| 6,114,259 A | * | 9/2000 | Sukharev et al. | 438/789 |
| 6,147,012 A | | 11/2000 | Sukharev et al. | 438/787 |
| 6,153,524 A | * | 11/2000 | Henley et al. | 438/691 |
| 6,204,192 B1 | | 3/2001 | Zhao et al. | 438/723 |
| 6,232,658 B1 | | 5/2001 | Catabay et al. | 257/701 |

OTHER PUBLICATIONS

McClatchie, S., et al., "Low Dielectric Constant Oxide Films Deposited Using CVD Techniques", *1998 Proceedings Fourth International DUMIC Conference*, Feb. 16–17, 1998, pp. 311–318.

Peters, Laura, "Pursuing the Perfect Low–k Dielectric", *Semiconductor International*, vol. 21, No. 10, Sep., 1998, pp. 64–66, 68, 70, 72, and 74.

"Plasma Implantation Concept" (obtained from Internet on May 8, 2000), Silicon Genesis Corporation (SiGen), 590 Division Street, Campbell, CA 95008.

Talevi, R., et al., "Material and Process Studies in the Integration of Plasma–Promoted Chemical–Vapor Deposition of Aluminum with Benzocyclobutene Low–Dielectric Constant Polymer", *Journal of Vacuum Science & Technology B*, vol. 18, No. 1, Jan.–Feb., 2000, pp. 252–261 (Abstract only).

Sugahara, Satoshi, et al., "Chemical Vapor Desposition of $CF_3$–Incorporated Silica Films for Interlayer Dielectric Application", 1999 Joint International Meeting, *Electrochemical Society Meeting Abstracts*, vol. 99–2, 1999, Abstract No. 746.

* cited by examiner

```
┌─────────────────────────────────────────┐
│  MOUNTING ON AN ELECTRICALLY CONDUCTIVE │
│     SUBSTRATE SUPPORT IN A REACTOR A    │
│    SEMICONDUCTOR SUBSTRATE WITH A FILM  │
│      OF LOW K DIELECTRIC MATERIAL ON IT │
└─────────────────────────────────────────┘
                    │
┌─────────────────────────────────────────┐
│   NEGATIVELY BIASING THE SEMICONDUCTOR  │
│   SUBSTRATE BY CONNECTING THE SUBSTRATE │
│   SUPPORT IN THE REACTOR TO THE NEGATIVE│
│      TERMINAL OF A DC POWER SUPPLY      │
└─────────────────────────────────────────┘
                    │
┌─────────────────────────────────────────┐
│    FLOWING INTO THE REACTOR A GASEOUS   │
│        OR VAPOROUS SOURCE OF HYDROGEN   │
└─────────────────────────────────────────┘
                    │
┌─────────────────────────────────────────┐
│ IGNITING A HYDROGEN PLASMA IN THE REACTOR│
│  TO PROVIDE A SOURCE OF POSITIVELY      │
│         CHARGED HYDROGEN IONS           │
└─────────────────────────────────────────┘
                    │
┌─────────────────────────────────────────┐
│     IMPLANTING HYDROGEN IONS FROM THE   │
│   HYDROGEN PLASMA INTO THE FILM OF LOW K│
│  DIELECTRIC MATERIAL TO INHIBIT CRACKING│
│    OF THE FILM OF LOW K DIELECTRIC      │
│                MATERIAL                 │
└─────────────────────────────────────────┘
```

PROCESS TO PROVIDE ENHANCED RESISTANCE TO CRACKING AND TO FURTHER REDUCE THE DIELECTRIC CONSTANT OF A LOW DIELECTRIC CONSTANT DIELECTRIC FILM OF AN INTEGRATED CIRCUIT STRUCTURE BY IMPLANTATION WITH HYDROGEN IONS

BACKGROUND OF THE INVENTION

1. Field of the Invention

This invention relates to integrated circuit structures. More particularly, this invention relates to a process for treating a film of low dielectric constant (k) dielectric material of an integrated circuit structure on a semiconductor substrate by implanting the film with hydrogen ions to inhibit subsequent cracking of the film of low k dielectric material and to further reduce the dielectric constant of the low k dielectric film.

2. Description of the Related Art

The shrinking of integrated circuits has resulted in levels of electrically conductive interconnects being placed closer together, as well as reduction of the horizontal spacing between the electrically conductive interconnects, such as metal lines, on any particular level of such interconnects. As a result, capacitance has increased between such conductive portions, resulting in loss of speed and increased cross-talk. One proposed approach to solving this problem of high capacitance is to replace the conventional silicon oxide ($SiO_2$) dielectric material, having a dielectric constant (k) of about 4.0, with another insulation material having a lower dielectric constant to thereby lower the capacitance.

In an article by L. Peters, entitled "Pursuing the Perfect Low-K Dielectric", published in Semiconductor International, Volume 21, No. 10, September 1998, at pages 64–74, a number of alternate dielectric materials are disclosed and discussed. Included in these dielectric materials is a description of a low k dielectric material having a dielectric constant of about 3.0 formed using a Flowfill chemical vapor deposition (CVD) process developed by Trikon Technologies of Newport, Gwent, U. K. The process is said to react methyl silane ($CH_3$—$SiH_3$) with hydrogen peroxide ($H_2O_2$) to form monosilicic acid which condenses on a cool wafer and is converted into an amorphous methyl-doped silicone oxide which is annealed at 400° C. to remove moisture. While the use of carbon-doped silicon oxide dielectric materials, as well as other materials mentioned in the Peters article, has resulted in a reduction in capacitance in integrated circuit structures utilizing such materials, a problem has been noted in the processing of such low k dielectric materials. After formation of a film of low k dielectric material, it is customary to subject the film to an anneal to drive off any moisture which may have formed during the process of making and depositing the low k film. The low k dielectric film has been noted to have a tendency to develop cracks during such exposure to elevated temperatures. Presumably the cracking results from stresses developed in the film during polymerization and structure formation which is accelerated by heating. The removal of water from the film during the heating step and resultant increase in film porosity may result in film shrinkage. The differences between the physical properties (thermal expansion coefficients, rigidity, etc.) of the low k film and the substrate may also contribute to the cracking problem.

In any event, the cracking of films of low k dielectric material during subsequent exposure to high temperatures, such as found in annealing processes (e.g., 400° C. or higher), results in an unacceptable reduction in yield which must be addressed. It would, therefore, be desirable to provide a process for treating such films of low k dielectric material to inhibit cracking of such films upon exposure to annealing temperatures.

It has been proposed by others to treat the film of low k dielectric material in a hydrogen plasma to enhance the resistance to cracking. However, such plasma treatment has been found to be only superficial, affecting only the surface and a very shallow depth of the film. Apparently, normal plasma conditions are insufficient to affect the deeper levels or regions of the low k film of dielectric material. The computation of the penetration depth of the dopant peak Rp of $H^+$ ions with the energy ~500 eV (the average ion energy of hydrogen ions in a plasma generated in a diode mode) into amorphous silicon oxide ($SiO_2$) film shows that the Rp is near 100 Angstroms (Å). In reality, the dominant ions in a hydrogen plasma are $H_2^+$ ions, and the penetration depth of these ions into $SiO_2$ will be even smaller. Therefore the bulk of low k dielectric films, which may range from 4000 Å to 8,000 Å in thickness, cannot be treated by a conventional hydrogen plasma.

Chu et al., in an article entitled "A New Way To Make SOI Wafers", published in the May 1997 edition of Solid State Technology, describes the use of plasma immersion ion implantation (PIII) for implanting oxygen in the formation of SOI (silicon-on-insulator) wafers, and further describes the implantation of helium and hydrogen into the silicon wafer by PIII to form a plane of implanted ions in the wafer along which cracking of the wafer will occur.

SUMMARY OF THE INVENTION

A film of low k dielectric material formed on a semiconductor substrate is treated to inhibit subsequent cracking of the film of low k dielectric material, and to further reduce the dielectric constant of the low k dielectric material by implanting the film of low k dielectric material with hydrogen ions by applying a negative DC bias to the semiconductor substrate in the presence of a plasma in hydrogen-containing gases. The semiconductor substrate, with the film of low k dielectric material thereon, is mounted on an electrically conductive substrate support in a reactor and a negative DC bias is applied to the semiconductor substrate by connecting the electrically conductive substrate support to a source of negative DC bias while hydrogen ions are generated by the plasma in the reactor to thereby cause hydrogen ions to implant into the film of low k dielectric material on the semiconductor substrate to thereby inhibit cracking of the low k film of dielectric material, and to further reduce the dielectric constant of the film.

BRIEF DESCRIPTION OF THE DRAWINGS

The sole FIGURE is a flowsheet illustrating the process of the invention.

DETAILED DESCRIPTION OF THE INVENTION

The invention comprises a process for treating a film of low k dielectric material, formed on a semiconductor substrate, to inhibit cracking of the film of low k dielectric material that can occur during baking or curing of the film, and to further reduce the dielectric constant of the low k dielectric material. The process of the invention comprises implanting the film of low k dielectric material with hydrogen ions by applying a negative DC bias to the semiconductor substrate in the presence of hydrogen ions from plasma. The inhibition of cracking and further reduction of the dielectric constant of the low k dielectric material by the process of the invention nay be possible because of developing of silicon-hydrogen bonds resulting in (i) less polarized bonding than the silicon-oxygen bonds; and (ii) less shrinkage of the film during bake and curing. By reducing the percentage of silicon-oxygen bonds, the implanted hydrogen may also increase the porosity of the film of low k dielectric material, resulting also in further lowering of the k value of the dielectric material.

The terms "low k dielectric material" or "low dielectric constant dielectric material", as used herein, are intended to refer to a dielectric material having a dielectric constant below about 4, and preferably about 3.5 or less. Typically the terms "low k dielectric material" or "low dielectric constant dielectric material", as used herein, refer to a dielectric material having a dielectric constant of from as low as about 2.5 to about 3.5.

The film of low k dielectric material formed on the semiconductor substrate usually will range in thickness from about 200 nanometer (nm) to about 1,000 nm, and preferably from about 400 nm to about 800 nm, although either thinner or thicker films may be used in the process of the invention if desired. Usually the film of low k dielectric material is formed over an underlying integrated circuit structure of which it becomes a part. The film of low k dielectric material may, for example, comprise a low k carbon-doped silicon oxide dielectric material which is formed by reacting a carbon-substituted silane with a mild oxidizing agent such as hydrogen peroxide to form a film of carbon-doped low k silicon oxide dielectric material. The invention may also be useful in the treatment of other types of low k dielectric material such as hydrogen-doped or fluorinated silicon oxide dielectric films.

To carry out the hydrogen implant process of the invention, the semiconductor substrate, having the film of low k dielectric material formed thereon, is placed in a vacuum chamber on an electrically conductive substrate support. The vacuum chamber is preferably maintained at a pressure ranging from about 0.1 millitorr to about 100 milliTorr, and at a temperature ranging from about 10° C. to about 40° C., and preferably from about 20° C. to about 30° C., during the hydrogen implantation.

The electrically conductive substrate support on which the semiconductor substrate is mounted during the implantation is electrically connected to the negative terminal of a DC power supply to provide a negative bias on the semiconductor substrate. The DC power supply should be capable of providing a negative bias to the semiconductor substrate of from about 2 kilo volts (kV) to about 125 kV. Typically, the voltage used to negatively bias the semiconductor substrate will range from about 10 kV to about 100 kV for the film thickness range noted about. It will, of course, be appreciated that the negative bias voltage applied to the semiconductor support will determine the depth of the implant of the hydrogen ions into the low k film of dielectric material. The lower the DC bias voltage applied to the substrate support, the more shallow will be the depth of the peak concentration or Rp of the implanted hydrogen ions, and vice versa. Since it is desired to uniformly implant the entire thickness of the film of low k dielectric material with hydrogen ions, it is preferred to vary the DC bias applied to the substrate support during the hydrogen implantation so that the peak concentration (Rp) of the implanted hydrogen ions will be spread across the thickness of the low k film. However, it should also be noted that the ionized hydrogen which is implanted into the film of low k dielectric material will comprise not only $H^+$ ions, but heavier $H_2^+$ and $H_3^+$ ions as well which will also contribute to a distribution of the implanted hydrogen in the film. The negative bias applied to the substrate support should be less than a bias level which would allow the Rp of the implanted hydrogen to extend into the integrated circuit structure beneath the film of low k dielectric material.

The source of hydrogen ions in the reactor comprises a hydrogen plasma which ionizes a source of hydrogen flowed into the reactor. The source of hydrogen may comprise any one or more gases or vaporized hydrogen-containing materials including, but not limited to $H_2$, $NH_3$, $H_2O$, and R, where R comprises a 1–4 carbon organic molecule (i.e, methane, ethane, propane, butane, etc.). It should be noted here that the use of a hydrogen-containing gas or vapor which also contains either nitrogen or oxygen may cause beneficial surface nitridation or oxidation of the film. The gaseous or vaporous source (or sources) of hydrogen is flowed into the reactor at a flow rate equivalent to a flow of from about 100 standard cubic centimeters per minute (sccm) to about 4,000 sccm into a 5 liter reactor. After the flow of the hydrogen-containing gas or vapor into the chamber commences, a plasma is ignited in the chamber using a conventional rf power source maintained at a power level ranging from about 100 watts to about 3,000 watts.

As previously described, this form of blanket ion implantation, known as plasma immersion ion implantation (PIII), wherein ions are implanted into a material using a plasma as the source of ions for the implant and using DC bias on the substrate support to provide the implant energy for the ions, is known in the art. Equipment for the performance of plasma immersion ion implant processes is commercially available from, for example, the Silicon Genesis Corporation as a SiGen 200 mm/300 mm PIII System.

The hydrogen ion implantation process is carried out for a period of from about 30 seconds to about 3 minutes, with a period of from about 1 minute to about 2 minutes preferred. After this the plasma is extinguished, the DC bias on the substrate is shut off, and the flow of hydrogen-containing gases into the reactor is terminated. The semiconductor substrate is then removed from the reactor and annealed at a temperature not exceeding 800° C., and preferably not exceeding about 600° C. for a short time (i.e., not more that several minutes) to spread the implanted hydrogen in the low k film of dielectric material. Most preferably, the implanted film is annealed by subjecting the substrate to a rapid thermal anneal (RTA) for a few seconds at a temperature not exceeding 800° C. to diffuse the implanted hydrogen uniformly throughout the low k film without, however, promoting further diffusion of the implanted hydrogen ions beyond the implanted low k film.

The following may serve to better illustrate the practice of the process of the invention. Two identically processed silicon semiconductor substrates may be provided having identical 6,000 Å low k carbon-doped silicon oxide dielectric films formed thereon by reacting carbon-substituted silane with hydrogen peroxide in a reactor. One of the resulting low k films is then treated in accordance with the process of the invention while the other is not. The substrate having the low k film to be treated is placed on an electrically conductive substrate support in a 5 liter reactor into which is flowed 500 sccm of hydrogen gas ($H_2$).

The electrically conductive substrate support is then biased at a negative DC voltage of about 10 kV and a plasma is ignited in the chamber. The negative DC bias voltage is then gradually raised to about 90 kV over a period of about 2 minutes after which the plasma would be extinguished, the DC bias would be shut off, and the flow of hydrogen gas into the chamber would be terminated. The treated substrate would then be removed from the chamber and subject to an RTA, e.g., for 30 seconds at 800° C. When both substrates are then subjected to a conventional anneal at 800° C. for a period of 30 minutes to an hour to remove moisture and other contaminants, subsequent examination of both substrates will reveal the presence of cracking in the untreated substrate not apparent in the treated substrate, indicating that the hydrogen implant process of the invention has inhibited the cracking of the treated low k film. Testing of the material to determine the dielectric constant of the treated low k dielectric material should show either a lowering of the dielectric constant or at least no increase in the dielectric constant despite the further processing of the low k dielectric film.

Thus, the invention provides a process for implanting hydrogen into a film of low k dielectric material to inhibit cracking of the low k film during subsequent processing of the treated low k film. The energetic hydrogen ions apparently can cure the film structure by adding hydrogen to the bonding network. The implanted hydrogen may protect —$CH_3$ groups in the film (when such are present) from decomposing during subsequent heat treatments possibly by creating new H-terminated bonds, which may act to either lower the dielectric constant or else at least preserve the low dielectric constant characteristics of the dielectric material. The non-bonding implanted hydrogen will maintain an internal pressure in the film. All these factors may secure film porosity and, as a result, reduce the k value of the film, as well as inhibit or prevent cracking. In addition, the implanted hydrogen ions can improve film polymerization and accelerate water removal/desorption from the low k film.

Having thus described the invention what is claimed is:

1. A process for treating a film of low k dielectric material formed on a semiconductor substrate to inhibit cracking of said film of low k dielectric material, which comprises implanting said film of low k dielectric material with hydrogen ions by applying a negative DC bias to said semiconductor substrate in the presence of a plasma of hydrogen ions.

2. The process of claim 1 wherein said negative DC bias applied to said semiconductor substrate ranges from about 10 kV to about 100 kV.

3. The process of claim 1 wherein said film of low k dielectric material ranges in thickness from about 400 nm to about 800 nm, and said negative DC bias applied to said substrate support is varied from about 10 kV to about 100 kv during the implantation to distribute the hydrogen ions throughout the thickness of the film of low k dielectric material.

4. The process of claim 1 wherein said hydrogen ions are formed in a hydrogen plasma generated in a chamber containing said semiconductor substrate.

5. The process of claim 4 wherein said hydrogen ions are formed in said plasma by ionization of one or more gaseous sources of hydrogen.

6. The process of claim 5 wherein said one or more gaseous sources of hydrogen are selected from the group consisting of $H_2$, $NH_3$, $H_2O$, and R, where R comprises a 1–4 carbon organic molecule.

7. The process of claim 1 wherein said film of low k dielectric material implanted by said hydrogen ions comprises a low k carbon-doped silicon oxide dielectric material formed by reacting a hydrocarbon-substituted silane with a mild oxidizing agent.

8. A process for treating a film of low k dielectric material formed on a semiconductor substrate to inhibit cracking of said film of low k dielectric material during subsequent exposure of said film of low k dielectric material to elevated temperatures, and to further reduce or preserve the low dielectric constant of the dielectric material, which comprises:

a) mounting on an electrically conductive substrate support in a reactor a semiconductor substrate having a film of low k dielectric material previously formed thereon;

b) applying a negative DC bias to said substrate support in said reactor;

c) flowing one or more hydrogen-containing gases or vapors into said reactor; and d) igniting a plasma in said chamber;

whereby hydrogen ions generated by said plasma are implanted into said film of low k dielectric material by said negative DC bias on said substrate support.

9. The process of claim 8 wherein said reactor is maintained at a pressure ranging from about $10^{-4}$ milliTorr to about $10^{-3}$ milliTorr during said implantation.

10. The process of claim 8 wherein said reactor is maintained within a temperature range of from about 10° C. to about 40° C. during said hydrogen implantation.

11. The process of claim 8 wherein said reactor is maintained within a temperature range of from about 20° C. to about 30° C. during said hydrogen implantation.

12. The process of claim 8 wherein said implantation is carried out for a period of from about 1 to about 3 minutes.

13. The process of claim 8 wherein said film of low k dielectric material ranges in thickness from about 400 nm to about 800 nm, and said negative DC bias applied is varied from about 10 kV to about 100 kv during the implantation to distribute the hydrogen ions throughout the thickness of the film of low k dielectric material.

14. The process of claim 8 wherein said hydrogen ions are formed in said plasma by ionization of one or more hydrogen-containing gases or vapors selected from the group consisting of $H_2$, $NH_3$, $H_2O$, and R, where R comprises a 1–4 carbon organic molecule.

15. The process of claim 14 wherein said one or more hydrogen-containing gases or vapors are flowed into said reactor at a flow rate equivalent to a flow of from about 100 sccm to about 4,000 sccm into a 5 liter reactor.

16. The process of claim 8 wherein said plasma is maintained in said reactor at a power level ranging from about 100 watts to about 3,000 watts during said implantation.

17. The process of claim 8 wherein said film of low k dielectric material implanted by said hydrogen ions comprises a low k carbon-doped silicon oxide dielectric material formed by reacting a hydrocarbon-substituted silane with a mild oxidizing agent.

18. A process for treating a film of low k dielectric material formed on a semiconductor substrate to inhibit cracking of said film of low k dielectric material during subsequent exposure of said film of low k dielectric material to elevated temperatures which comprises:

a) mounting on an electrically conductive substrate support, in a reactor maintained at a pressure of from about $10^{-4}$ milliTorr to about $10^{-3}$ milliTorr and a temperature of from about 20° C. to about 30° C., a semiconductor substrate having from about 400 nm to about 800 nm of a film of low k dielectric material previously formed thereon;

b) applying a negative DC bias ranging from about 10 kV to about 100 kV to said substrate support in said reactor;

c) flowing into said reactor, at a flow rate equivalent to a flow of from about 100 sccm to about 4,000 sccm into a 5 liter reactor, a hydrogen-containing gas or vapor selected from the group consisting of $H_2$, $NH_3$, $H_2O$, and R, where R comprises a 1–4 carbon organic molecule;

d) igniting a plasma in said chamber to form hydrogen ions in said chamber;

e) maintaining said plasma in said reactor at a power level ranging from about 100 watts to about 3,000 watts for a period of from about 1 to about 3 minutes; and f) then extinguishing said plasma;

whereby hydrogen ions generated by said plasma are implanted into said film of low k dielectric material by said negative DC bias on said substrate support.

19. The process of claim 18 wherein said film of low k dielectric material ranges in thickness from about 400 nm to about 800 nm, and said negative DC bias applied to said substrate support is varied from about 10 kV to about 100 kv during the implantation to distribute the hydrogen ions throughout the thickness of said film of low k dielectric material.

20. The process of claim 18 wherein said film of low k dielectric material implanted by said hydrogen ions comprises a low k carbon-doped silicon oxide dielectric material formed by reacting a hydrocarbon-substituted silane with a mild oxidizing agent.

* * * * *